(12) United States Patent
Putman et al.

(10) Patent No.: US 7,747,917 B2
(45) Date of Patent: Jun. 29, 2010

(54) SCAN CELLS WITH MINIMIZED SHOOT-THROUGH AND SCAN CHAINS AND INTEGRATED CIRCUITS USING THE SAME

(75) Inventors: Richard Putman, Austin, TX (US); Michael Kost, Austin, TX (US); Sanjay Pillay, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 12/154,589

(22) Filed: May 23, 2008

(65) Prior Publication Data

US 2008/0307280 A1 Dec. 11, 2008

Related U.S. Application Data

(63) Continuation of application No. 11/363,307, filed on Feb. 27, 2006, now abandoned, which is a continuation of application No. 10/266,833, filed on Oct. 7, 2002, now abandoned.

(51) Int. Cl.
*G01R 31/28* (2006.01)
*H03K 3/289* (2006.01)
*H03K 3/356* (2006.01)

(52) U.S. Cl. .................. 714/726; 714/727; 714/729; 714/731; 327/202; 327/212

(58) Field of Classification Search ............ 714/726, 714/727, 729, 731; 327/202, 212
See application file for complete search history.

(56) References Cited

U.S. PATENT DOCUMENTS

| | | | | |
|---|---|---|---|---|
| 5,784,384 A | * | 7/1998 | Maeno | 714/726 |
| 6,081,913 A | * | 6/2000 | Narayanan et al. | 714/724 |
| 7,197,681 B2 | * | 3/2007 | Dervisoglu et al. | 714/726 |

* cited by examiner

*Primary Examiner*—John J Tabone, Jr.
(74) *Attorney, Agent, or Firm*—Thompson & Knight LLP; James J. Murphy

(57) ABSTRACT

A scan including data and shift inputs, and input selection circuitry for selecting between the data and shift inputs during normal, capture, and shift modes in response to only a first control signal and a second control signal. The input selection circuitry includes a first storage element for storing a bit representing a state of the first control signal in response to a change in state of the second control signals and multiplexing circuitry. The multiplexing circuitry is operable in the normal mode to select the data input in response to a first state of the second control signal, in the capture mode to select the data input when the bit stored in the first storage element represents a first state of the first control signal, and in the shift mode to select the shift input when the bit stored in the first storage element represents a second state of the first control signal. A second storage element stores, in response to the first state of the first control signal, data presented at the selected one of the data and shift inputs.

14 Claims, 11 Drawing Sheets

SCAN CELLS WITH MINIMIZED SHOOT-THROUGH AND SCAN CHAINS AND INTEGRATED CIRCUITS USING THE SAME

CROSS-REFERENCE TO RELATED APPLICATION

The present application is a continuation of U.S. patent application Ser. No. 11/363,307 filed Feb. 27, 2006 now abandoned, titled "Scan Cells with Minimized Shoot-Through and Scan Chains and Integrated Circuits Using the Same," and naming Richard Putman, Michael Kost, and Sanjay Pillay as inventors; which is a continuation of U.S. patent application Ser. No. 10/266,833, filed Oct. 7, 2002 now abandoned.

FIELD OF INVENTION

The present invention relates in general to scan testing in integrated circuits and in particular, to scan cells with minimized shoot-through and scan chains and integrated circuits using the same.

BACKGROUND OF INVENTION

Scan testing is an important tool for efficient development and production testing of complex integrated circuits, such as systems-on-a-chip (SOCs). Generally, scan cells, which typically are one-bit register elements, are associated with test critical I/O nodes of a given functional circuit block. The scan cells of one or more circuit blocks are connected in serial to form a scan chain (shift register). During normal functional operations of the system, the scan cells behave like traditional register elements; however, during test operations, a test vector is shifted into the scan chain in response to a clock and the individual bits presented in parallel at the functional circuit input nodes. During a subsequent capture operation, the resulting bits at the corresponding output of the functional circuitry nodes are clocked in parallel into the scan cells. Multiple capture operations are possible, depending on the tests being performed. The resulting vector is then shifted out of the scan chain for observation and analysis.

Implementing scan testing in an SOC with multiple functional blocks operating from multiple clock domains and sub-domains is a formidable challenge, particularly when thousands of scan cells in multiple-scan chains are required to implement a thorough test protocol. Among the problems faced is reconciling differences between the clock domains/sub-domains during scan testing such that the system can be tested synchronously. Additionally, the order and reordering of the scan cells in a given scan chain, as well as selecting the appropriate insertion points, should be optimized for physical layout and test operational efficiency.

Specifically, in conventional scan testing schemes, the functional clocks which drive the associated functional circuitry are also used to generate the clocks used to scan and capture data in the scan chain. Normally, all cells in a given clock domain should be contiguous and therefore lockup latches are provided in the scan chain when that scan chain crosses clock domain boundaries. In turn, it becomes difficult to form scan chains which have optimal physical lay out on the chip or which optimally exercise interrelated functional blocks.

Another problem is clock skew between the various clocks being used to shift and capture data across the design in the scan chains. Clock skew, which is typically caused by propagation delays through the clock lines, can result in data "shoot-through" where data bits are not clocked into the proper scan cells during shifting and capture operations. Moreover, it becomes difficult to build scan chains when multiple clock domains are being utilized on chip and/or when functionally connected cells are not operating from the same clock branch.

SUMMARY OF INVENTION

The present inventive concepts advantageously address the problems of scan and capture shoot-through during scan testing. According to one selected embodiment, a scan cell is disclosed for preventing shoot-through in a scan chain operating in shift phase and has a first output for driving an input of associated functional circuitry and a second output for driving a following scan cell in the scan chain. An input multiplexer controlled by an enable signal selects between a first input during the shift phase and a second input during the capture phase. A first stage registers an input bit received from the input multiplexer and drives the first output of the scan cell. A second stage latches a output bit received from the first stage and has an output for driving the second output of the scan cell.

The embodiments of the present concepts are particularly applicable to scan chains composed of a large, or very large, number of scan cells as necessary to test complicated integrated circuits such as systems-on-a-chip. Among other things, by minimizing the problems of clock skew and resulting shoot-through, the timing constraints on the various clocks and signals needed to perform scan testing can be relaxed. Moreover, scan chains can be designed which cross clock domain and sub-domain boundaries and/or which use cells which are relatively widely spaced on the chip. Consequently, the options for ordering and reordering the cells of a scan chain are substantially increased.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-8 of the drawings, in which like numbers designate like parts.

Figure 1A:
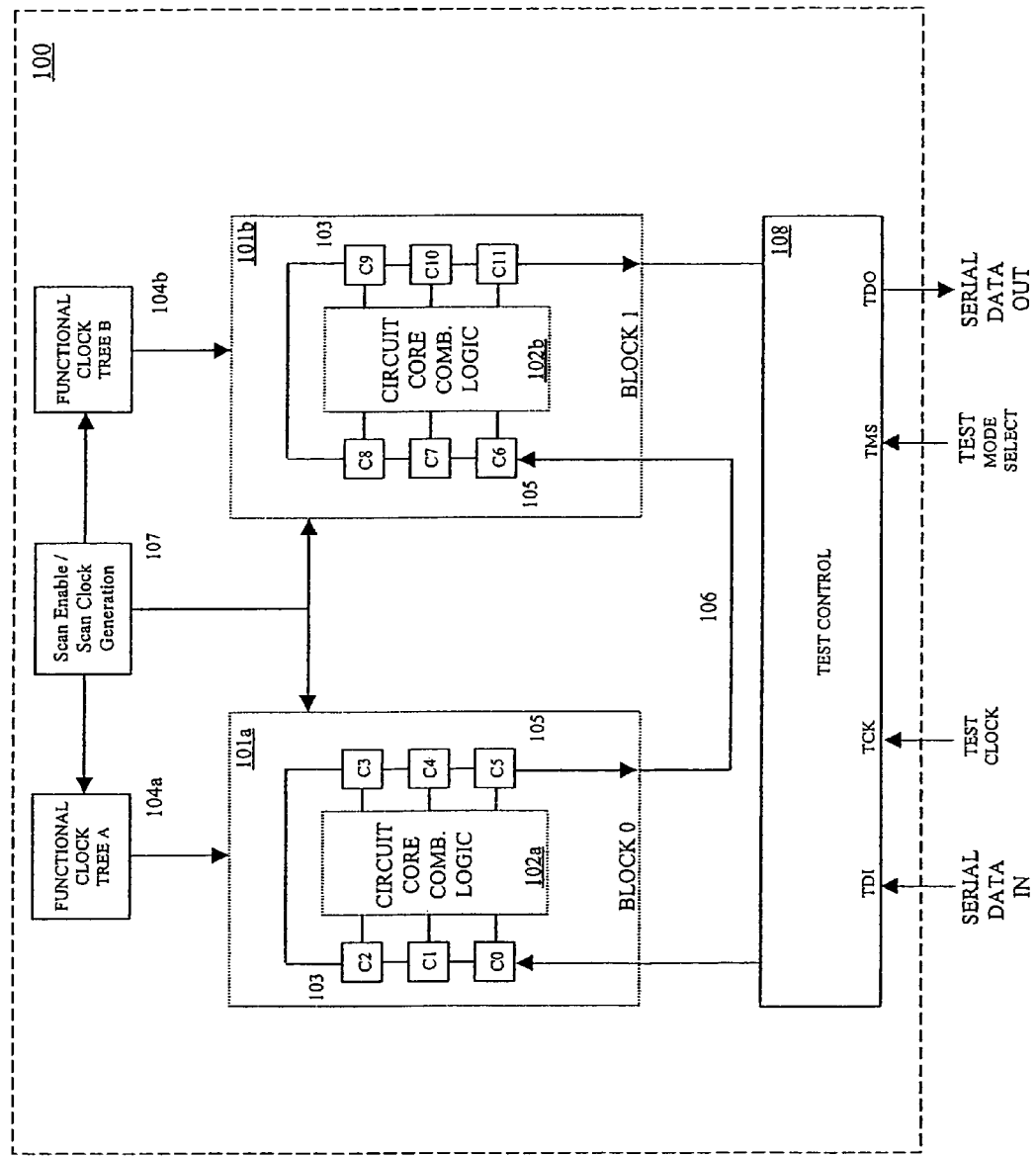
FIG. 1A is a conceptual block diagram of a representative system-on a-chip with scan testing support according to the inventive concepts.

For purposes of describing present inventive concepts, a conceptual block diagram of a representative system 100 with scan testing support is shown in FIG. 1A. System 100 includes a pair of functional circuit blocks 101a-101b (Block 0 and Block 1) each having a circuit core 102a-102b, consisting of combinational logic and an associated number of test critical I/O terminals or nodes 103. It should be noted that the small number of circuit blocks and I/O terminals shown has been arbitrarily selected for discussion purposes; actual applications will typically be substantially more complex. In the illustrated embodiment, system 100 fabricated on a single integrated circuit chip but in alternate embodiments may be constructed with multiple chips mounted on a support and interconnect structure such as a printed circuit board. For discussion purposes, each functional circuit block 101a-101b is shown with an associated clock tree 104a-104b generating the clocks and sub-clocks required during normal (functional) operation of system 100. As will be discussed further below, in selected embodiments of the present concepts, a single scan enable signal (SCAN_ENABLE) and/or a set of independent scan clocks, is generated in scan enable/scan clock generation block 107 and drives all scan chains! scan cells in system 100. As shown in FIG. 1A, scan enable/scan clock generation circuitry operates in conjunction with functional clock trees 104a and 104b.

Each input/output node for the functional circuitry being tested is associated with a scan cell 105 (Cx), where x is an arbitrary integer index representing the given scan cell. The scan cells are serially interconnected to create a scan chain, one of which is generally represented by the continuous line 106 extending through scan cells 105 in FIG. 1A. System 100 also includes test control circuitry 108 including an interface having serial data input and output ports (TDI and TDO), a test clock input (TCK), and a test mode control port (TMS).

Figure 1B:
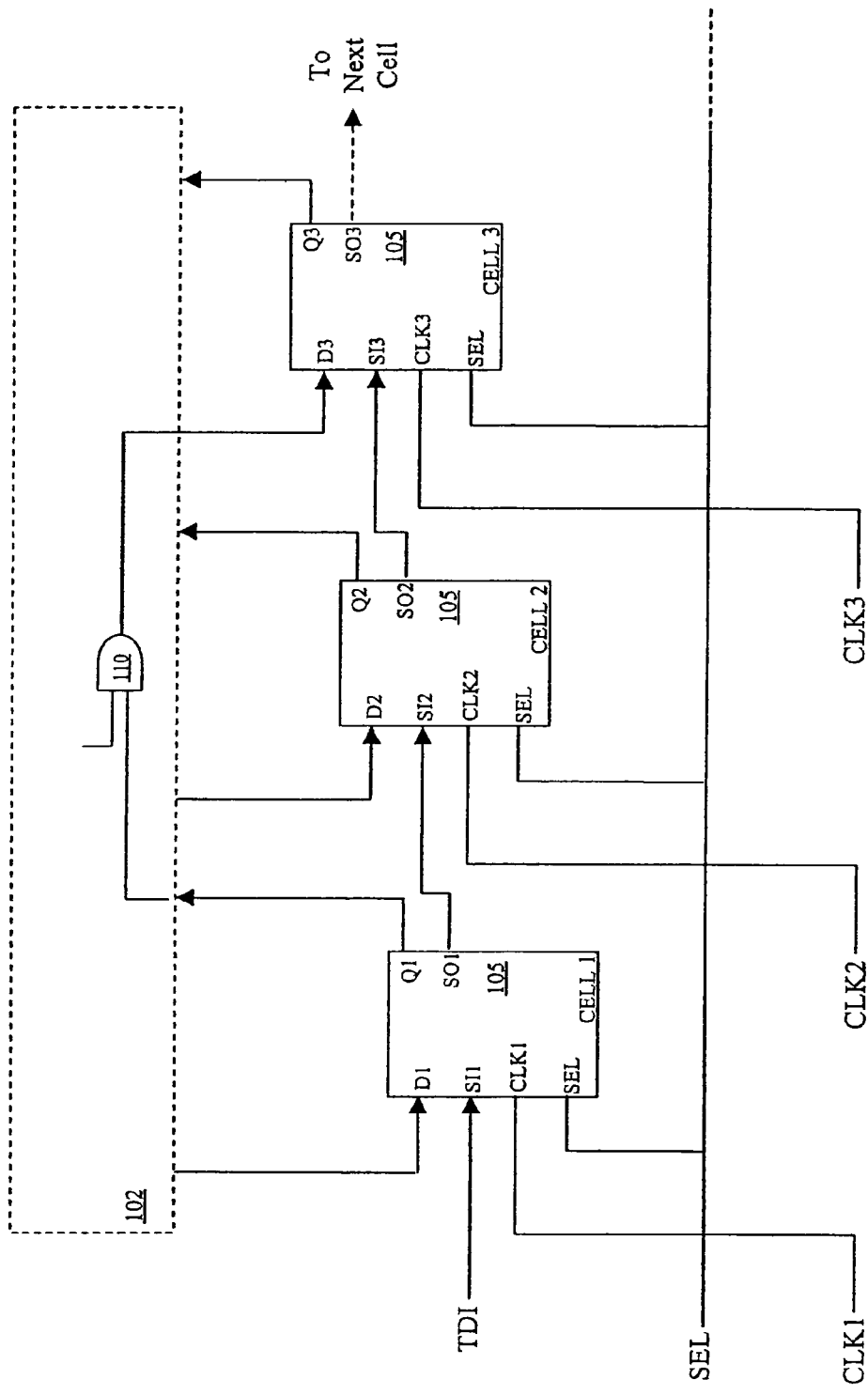
FIG. 1B depicts three exemplary scan cells of a scan chain in further detail.

Three exemplary scan cells 105 and the corresponding general combinatorial logic 102 is shown in further detail in FIG. 1B. While the depicted scan cells are shown electrically adjacent; physically they may be relatively widely spaced apart on system 100. Moreover, the general depiction of logic 102 is irrespective of functional block boundaries, for example in system 100, the boundaries of Blocks 0 and 1, as well as clock domain/sub-domain boundaries. As will be discussed further below, when the present inventive principles are applied, scan cell order on a given chain, scan cell spacing and functional clock and sub-clock domains are no longer critical factors in the scan test design.

The typical scan cell operates in one of three modes: normal (functional), shift, and capture. In the normal mode, the scan cells behave like normal register elements. The shift mode allows a pattern of test bits (i.e., a test vector) to be shifted in serial into the chain. The result bits are loaded into the scan chain registers in parallel during the capture mode. Then often, in shift mode, the results from operations on the test pattern by the functional circuitry are shifted out in serial.

Figure 1C:
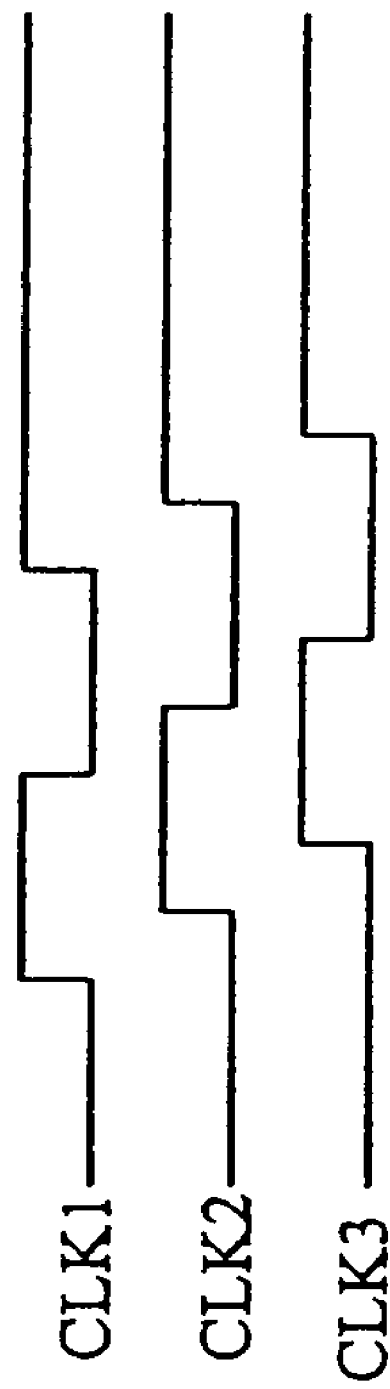
FIG. 1C is a timing diagram illustrating the problem of clock skew.

The general operation of the circuit shown in FIG. 1B and the problems of scan and capture shoot-through can be described in conjunction with the timing diagram of FIG. 1C. In a conventional system, these clocks are generated with clock tree for the functional clock domain or sub-clock domain timing the operations of the associated functional circuitry. This conventional clock generation scheme has a number of disadvantages. First, if a scan chain crosses clock domain boundaries, lockup latches must be placed between each pair of coupled cells operating in different clock domains. Lockup latches add complexity to the circuitry and consume significant amounts of chip area, especially if scan chains of hundreds or thousands of cells are involved. A second problem is clock skew, which is caused by differing propagation delays through the various clock paths. In FIG. 1C, the clocks CLK1-CLK3 are shown with an arbitrary amount of skew between edges, which will vary in actual applications depending on such factors as clock path length and the electrical characteristics of the given path. This clock path length often cannot be optimized since circuit blocks, as well as the associated scan cells, may not be physically proximate on the chip. Aligning clock edges in the generating clock tree is typically a difficult task when a large number of clocks are involved.

In conventional scan chains, such as that shown in FIG. 1B, the Q output of the leading cell is coupled to the scan in (SI) input of the following cell. (As will be discussed further, cells according to the present inventive concepts have an alternate scan output (SO) for making this serial connection.) Ideally, the control signal SEL is set to the scan state and data bits are scanned serially into the test path from the Q output of one cell to the Scan in (SI) input of the next cell. The number of clock periods required for moving a given bit of the test pattern into its final position in the chain is a function of the length of the chain, as in a traditional serial shift register. Once the test pattern has been shifted into the scan chain, the bits at the Q output are operated on by the combinatorial logic 102. The control signal SEL then transitions to the Capture state and the data at the D inputs to cells 105 are clocked through to the Q outputs and captured in parallel. SEL then returns to the shift mode and the results vector is then clocked out in serial to the test equipment.

In the ideal shift operation described above (either pre- or post-capture), the current bit at the output of leading scan cell in a logically connected pair of cells is clocked into the following cell of the pair before the data at the input of the leading cell Is clocked to the leading cell output, and hence the input of the following cell. For example, the current bit at the Q1 output of Cell 1 should ideally be clocked into the SI2 input to Cell 2 by CLK2 at or before the current bit at the S11 input to Cell 1 is clocked to output Q1, and consequently on to input Sl2, by CLK1. In actuality, due to clock skew, the bit at Sl1 may be clocked by CLK1 to output Q1 and input SI2 before CLK2 has clocked in the current bit at input S12 into Cell 2. Consequently, the bit at input S11 is not only clocked into Cell 1, as expected, but also improperly clocked into Cell 2 as well. The bit which should have been latched into Cell 2 is essentially overwritten and, depending on the logic states of the bits involved, may be lost. Depending on the docks used in the scan chain and the corresponding clock skew, the new bit input of Cell 1 at Sl1 can "shoot-through" additional cells past Cell 2 in a similar fashion.

Capture shoot-through is a related problem resulting from clock skew. For discussion purposes, exemplary logic 110 is shown within combinatorial logic 102 in FIG. 1B. Logic 110 operates on the bit at the Q1 output of Cell 1 and generates a result bit at the D3 input of Cell 3. During capture, the data at input D1 to Cell 1 is clocked by CLK1 to output Q1. Without clock skew, the current (correct) bit output from gate 110 at input D3 is captured in Cell 3 by clock CLK3. However, if the bit clocked through to output al propagates through logic 110 and appears at input D3 before the active edge of CLK3 arrives, due to clock skew, then this bit is captured in Cell 3 and the bit which should have been captured by Cell 3 is lost.

Again, such capture shoot through can occur throughout the scan chain, depending on the clocks, the delays through the combinatorial logic and corresponding clock skewing.

In conventional scan chains, dock skew and related timing problems can be addressed in a number of different ways. One possible technique is to attempt to precisely align the active edges of the scan clocks such that the clocks arrive at the dock inputs while the correct data appears at the corresponding data inputs (skew balancing). However, this technique is difficult to implement, in particular when a large number of clocks are implicated. Moreover, when there are multiple clock or sub-clock domains, the problem of skew balancing must be considered in light of the problem reconciling clocks to allow synchronous scan testing across the chip.

Another conventional technique addressing the problem of shoot-through while shifting is to insert a delay element in the scan path between scan cells to allow the data at the input of the following cell to be clocked through to its output before the new data from the leading cell appears at its input. One way this. can be done is by adding a latch between the scan output of the leading cell and the scan input of the trailing cell. The latch is then clocked with the complement of the clock signal driving the leading cell, which adds a delay of one-half a clock period into the transfer of data from the leading cell output to the trailing cell input. This technique however adds circuitry to the system, can consume a significant amount of chip area in systems employing a large number of scan cells, and it still does not solve the problem of capture shoot-through.

Another conventional technique for addressing capture shoot-through is to assign one primary input pin as a scan clock for each sub-clock domain and then force the ATPG tool to only pulse the scan clock of only one sub-clock domain at a time during capture. However, this technique will not work for large chips that have hundreds of sub-clock domains and consumes a not insignificant number of primary input pins of the chip. Another drawback to this technique is that by re-assigning otherwise functional input pins to be scan clocks, other controllability of the functional nature of these pins is diminished. In addition, the length of the scan vector and thus the test equipment memory requirement will increase by a not insignificant amount.

Figure 2A:
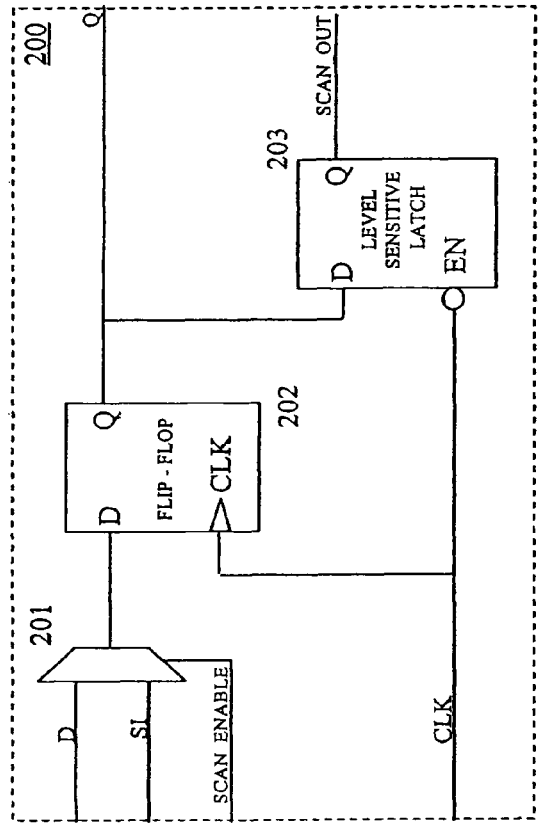
FIGS. 2A and 2B are respectively a functional block diagram of a first exemplary scan cell embodying the inventive concepts and a timing diagram of illustrating its operation.
Figure 2B:
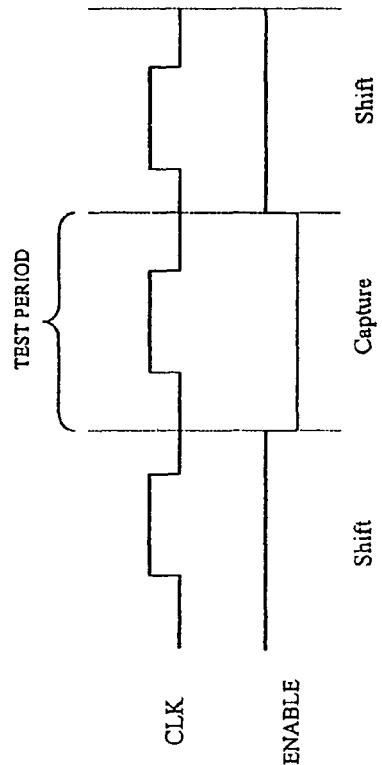

FIG. 2A is a functional block diagram of a first scan cell 200 embodying the inventive concepts. This embodiment is particularly useful for addressing the problem of data shoot through. A timing diagram illustrating a small number of exemplary test cycles is provided as FIG. 2B.

A front-end multiplexer 201, under control of enable signal SCAN_ENABLE selects between data presented by the combinatorial logic at the D input and data being shifted through the scan chain and appearing at the SI input. The selected data are clocked in into flip-flop 202 in response to the corresponding dock signal CLK. Clock signal CLK is generated from the corresponding functional clock tree 104, or preferably, a dedicated scan clock tree 107 optimized to synchronize scan testing across system 100. The Q output of flip-flop 202 provides one scan cell output for transmitting data to combinatorial logic 102.

Scan cell 200 also includes an integral level sensitive latch 203 which registers the state at the Q output of flip-flop 202 when enabled by the high periods of CLK. The Q output of latch 203 provides the SCAN_OUT (alternate) output, which drives the scan in (SI) input of the following cell in the scan chain.

In the scan (shift) mode, the new bit from the SI input of the preceding cell is clocked into flip-flop 202 on the active (rising) edge of CLK. At the same time, latch 203 latches and holds the current data in cell 200 data at the output SCAN_OUT until CLK transitions to a logic low while latch 203 is transparent. The delay provided by latch 203 allows the next cell in the chain to clock in the current data at its SI input before the new data appears at the output of latch 203. The primary disadvantage with scan cell 200, if a clock derived from the functional clock is used, is that flip-flop 202 will continue to flop (toggle) during device functional operation, thereby adding noise to the system. Also, the implementation of FIGS. 2A and 2B only solves the scan shift shoot-through problem.

Figure 3A:
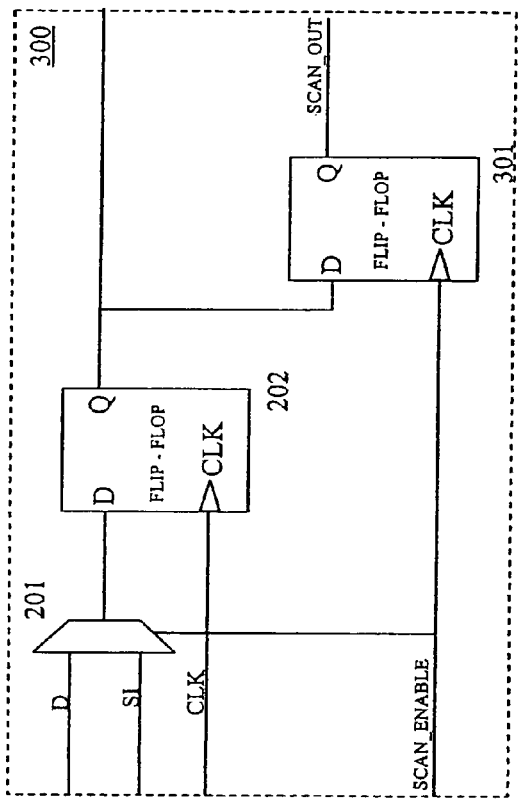
FIGS. 3A and 3B are respectively a functional block diagram of an second exemplary scan cell according to the inventive principles and a timing diagram illustrating its operation.
Figure 3B:
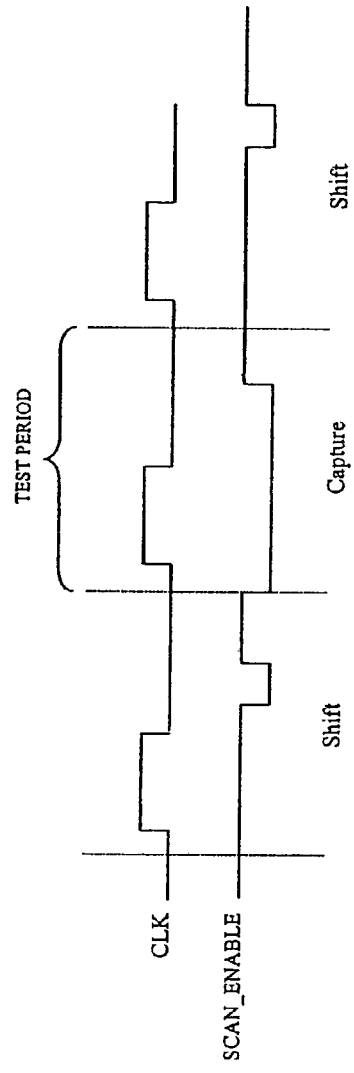

A second scan cell embodiment 300 addressing the issue of noise, independent of the choice of a clock from the functional clock domain/sub-domain, is shown in FIG. 3A. In scan cell 300, latch 203 has been replaced with a flip-flop 301. The Q output of flip-flop 301 drives the alternate output SCAN_OUT. Flip-flop 301 is clocked by the scan enable signal SCAN_ENABLE. An exemplary timing diagram is provided in FIG. 3B.

During a shift, SCAN_ENABLE is high and the data bit at scan input SI is clocked by CLK into flip-flop 202, as was done above. On the next rising (active) edge of scan enable signal SCAN_ENABLE, the data bit at the Q output of flip-flop 202 is clocked to the SCAN_OUT output by flip-flop 301. Flip-flop 30f then holds the current data bit at the output SCAN_OUT until the next scan cell 300 in the chain successfully clocks that current bit into its flip-flop 202. By manipulating the phase relationship between clock signal CLK and scan enable signal SCAN_ENABLE, clock skew can be reconciled. Advantageously, the timing of scan enable signal SCAN_ENABLE does not have to be as precisely controlled as would otherwise be required in traditional clock skew balancing; the only constraint being that the current bit is clocked to output SCAN OUT in sufficient time before the appropriate active edge of the clock clocking flip-flop 202 of the next cell arrives. One advantage of the embodiment of FIG. 3A is that flip-flop 301 does not toggle during normal functional operation.

Figure 4A:
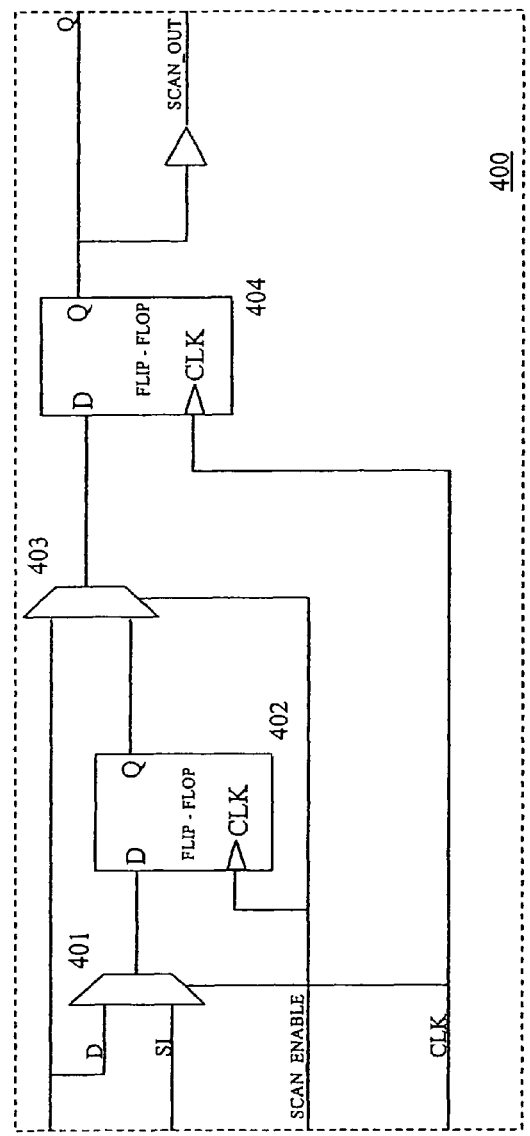
FIGS. 4A and 4B are respectively a functional block diagram of an third exemplary scan cell embodying of the inventive concepts and a timing diagram illustrating its operation.
Figure 4B:
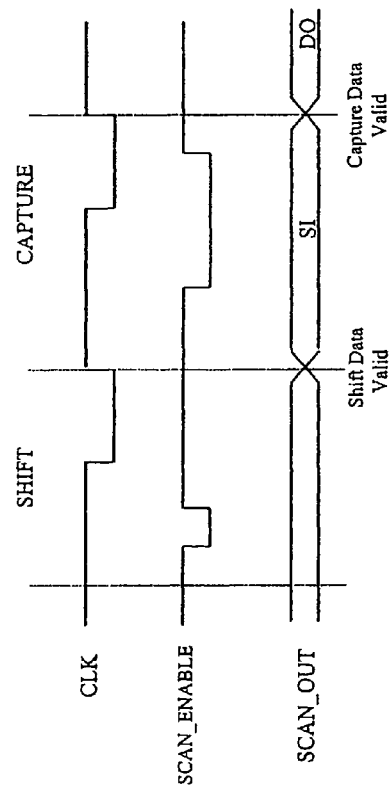

FIG. 4A illustrates a further scan cell embodiment 400 which addresses both the problems of shift and capture shoot-through. Here, two signals and a pair of flip-flops operate in the scan and capture modes generally shown in the timing diagram of FIG. 4B.

In the scan shift mode, clock signal CLK is initially in the logic high state such that multiplexer 401 passes the bit at the shift in (SI) input to the D input of first flipflop 402. On the next rising edge of scan enable signal SCAN_ENABLE, this bit is clocked to the Q output of flip-flop 402. With scan enable signal SCAN_ENABLE in the logic high state, multiplexer 403 presents the bit at the flip-flop 402 Q output to the D input of second flip-flop 404. On the next rising edge of the clock CLK the bit at the D input of second flip-flop 404 is shifted to the output SCAN_OUT for transmission to the next cell in the chain.

In the capture mode CLK transitions to a logic low state to pass the capture bit from the D input of multiplier 401 to the D input of flip-flop 402. On the next rising edge of scan enable signal SCAN_ENABLE, the capture bit is latched into flip-flop 402. With scan enable signal SCAN_ENABLE in the logic high state, multiplexer 403 switches the bit latched in flip-flop 402 to the input of second flip-flop 404. The captured bit is then clocked to the output SCAN_OUT with the next rising edge of CLK.

The two-signal approach of scan cell embodiment 400 insures that the slave flip-flop 404 is not updated until the master flip-flop 402 has clocked in the data at either the SI input or Data input to cell 400. One advantage is that by varying the phase relationship between clock signal CLK and scan enable signal SCAN_ENABLE, the timing between the shift and capture modes, as well as the holding period of the data in slave flip-flop 404, can be varied to eliminate the effects of clock skew in the scan chain. Additionally, clock skew balancing between clock signals and clock domains I sub-domains, even if the functional clock trees are used for scan timing, is less of a problem, since the data can be held long enough to prevent both scan shift and capture shoot-through.

Figure 5A:
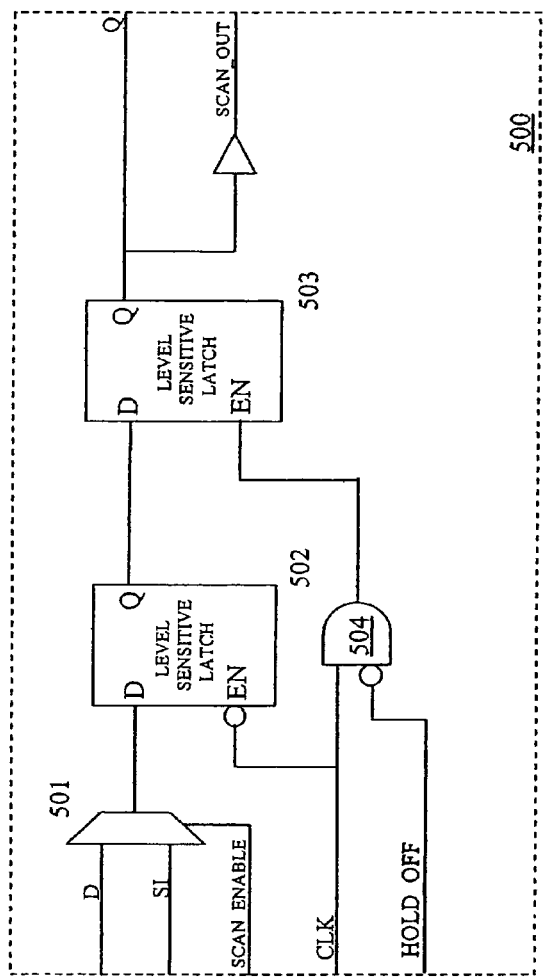
FIGS. 5A and 5B are respectively a functional block diagram of a fourth exemplary scan cell embodying the inventive concepts and a timing diagram illustrating its operation.
Figure 5B:
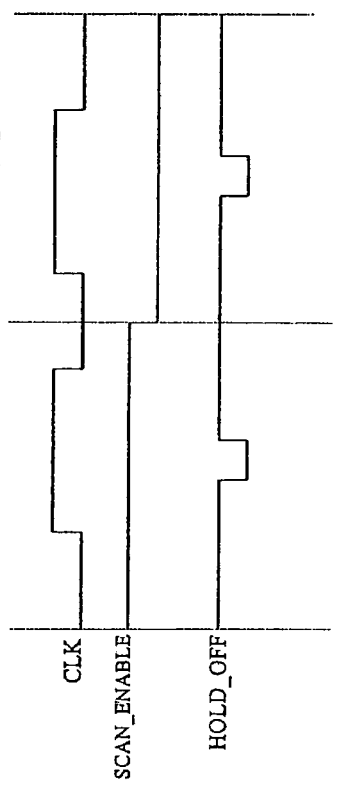

FIGS. 5A and 5B are respectively functional block and timing diagrams illustrating an exemplary structure and operations of a hold-off scan cell embodiment 500 to preventing shoot-through according to the inventive principles. In this case, an additional signal HOLDOFF prevents the slave stage of a master-slave latch from transitioning into the transparent state until the data bit is latched by the input signals into the master stage. Again, clock skew balancing between clocks across different clock domains or sub-domains is no longer as critical, since an arbitrarily long hold-off period can be set allowing all master stages within the chip to latch their data before the associated slave stages become transparent and the corresponding output signals propagate through the remainder of the scan chains.

As illustrated in FIG. 5A, during the shift phase, SCAN_ENABLE is in a logic high state and input multiplexer 501 selects the data at the SI input to cell 500. When clock CLK translation logic high, the input bit is latched into level sensitive master latch 502. The hold-off signal HOLD-OFF, gated with clock signal CLK through gate 504, latches the current bit at the output of master latch 502 into slave latch 503 after the predetermined hold-off period.

The capture phase (mode) is similar, with the exception that the data bit at input D to multiplexer 501 from the associated combinatorial logic block 102a or 102b is selected by the logic low state of scan enable signal SCAN_ENABLE.

Figure 6:
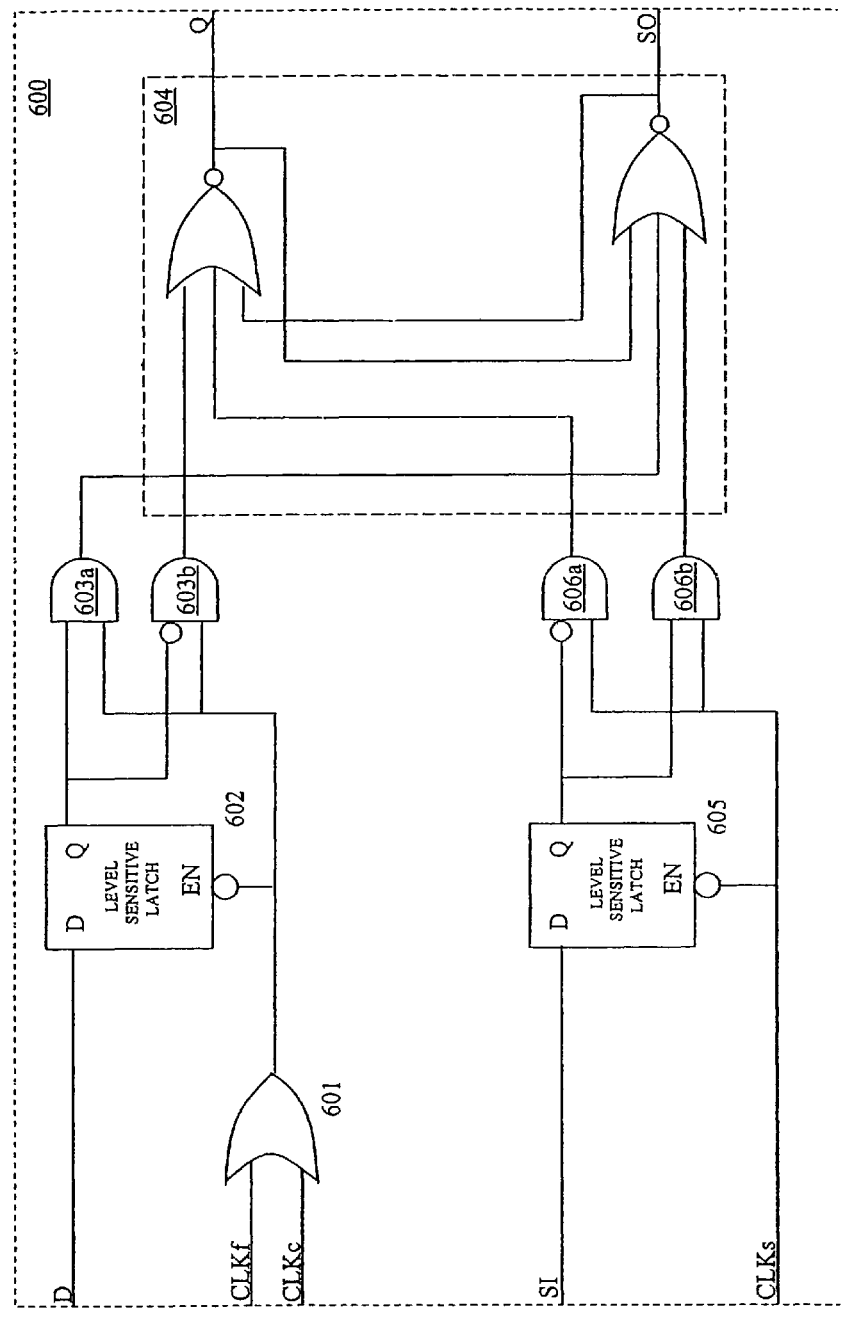
FIG. 6 is a functional block diagram of a fifth exemplary scan cell embodying the inventive principles.

Scan cell embodiment 600, shown in FIG. 6, utilizes three separate clock signals for controlling functional operations (CLKf), scan-in and scan-out (CLKs) and capture (CLKc), as generated by functional clock trees 104a and 104b and scan clock generation circuitry 107 of FIG. 1A. Each clock signal is separately skew balanced for its specific domain. In particular, the functional clock CLKf is skew balanced for the clock tree 104a and 104b driving the corresponding clock domain or sub-domain, in the traditional fashion. However, the scan clock signals (CLKs) are skew balanced for each entire scan chain and the capture clock signals (CLKc) for all scanned flip-flops in system 100. The scan and capture mode control is implicit in the generation of the clock signals, generally as follows.

In the functional mode, the data bit output from combinatorial logic 102 (see FIG. 1A) appearing at the D input of level sensitive latch 602 is latched by clock signal CLKf gated through gate 601. Logic gates 603a-603b gate the output bit from latch 602 along with clock signal CLKf to the appropriate inputs to latch 604 as a function of the data bit logic level. The output Q of latch 604 is then available for the next stage in combinatorial logic 102.

The capture mode is similar, with the exception that the capture clock signal CLKc latches the data into latch 602 and gates the latch output through gates 603a-603b. The bit held at the cell 600 output SO are then available for shift out in the scan mode to the SI input of the next cell in the chain.

For the scan (shift) mode, the scan clock signal CLKs latches the input data at input SI into level sensitive latch 605 and gates the corresponding output (at output Q) through gates 606a-606b to the inputs of latch 604. The bit at output SO can then be shifted to the next scan cell, as required, by a similar cycle of CLKs.

Figure 7:
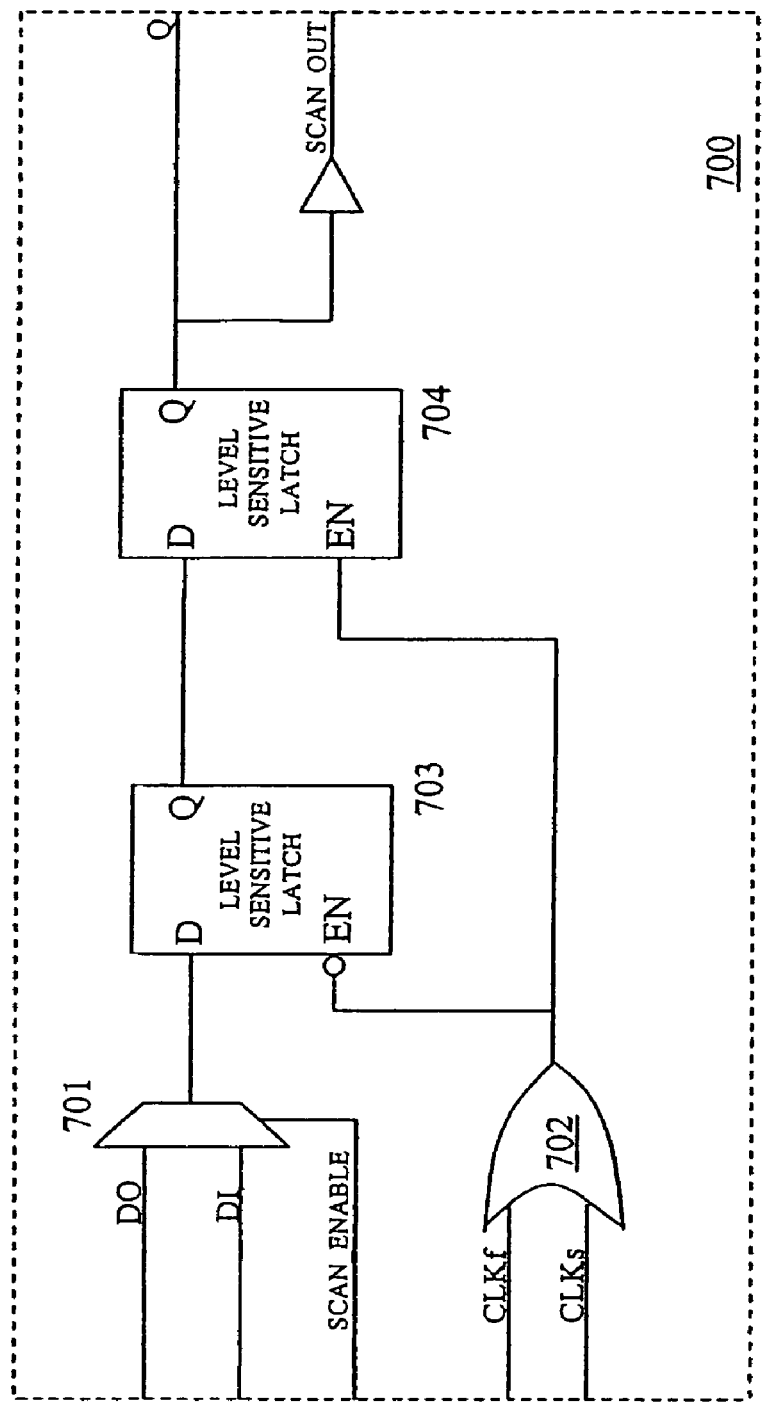
FIG. 7 is a functional block diagram of a sixth exemplary scan cell embodying the inventive concepts.

The three-clock embodiment of FIG. 6 can be reduced to a two clock signal and one select signal scan cell embodiment 700, as shown in FIG. 7 Here, the functional clock signal CLKf is skew balanced for the corresponding functional clock domain or sub-domain and the scan clock signal CLKs clock balanced for all scan cells across the chip. For the functional mode, the clock input is the clock signal CLKf and the scan enable signal SCAN_ENABLE is at a logic low, for scan-in or scan-out the clock input is the CLKs and the scan enable signal SCAN_ENABLE is at a logic high, and for capture, the clock input is the clock signal CLKs and the scan enable signal SCAN_ENABLE is at a logic low.

The input data selection is implemented by multiplexer 701 and clock selection by gate 702. Level sensitive latch 703 latches the selected input with the negative level of the selected clock and its output is in turn latched by level sensitive latch 704 with the positive level of the selected clock. Again, by using independent functional and scan clocks, each clock tree need only be skew balanced for its particular timing domain.

Figure 8A:
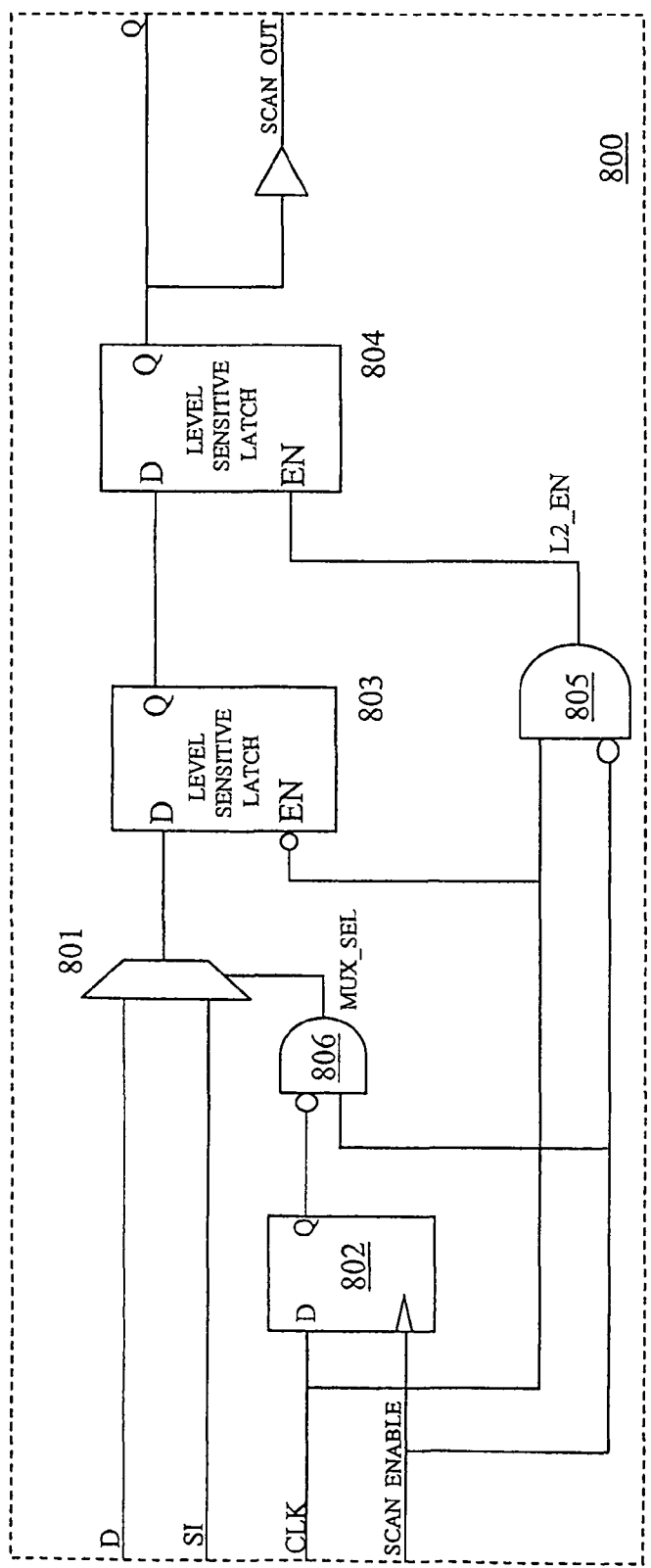
FIGS. 8A and 8B are respectively a functional block diagram of a seventh exemplary scan cell according to the inventive principles and a timing diagram illustrating its operation.

FIG. 8A is a functional block diagram of dual-signal scan cell 800 according to the inventive principles. The preferred timing of the input and selected cellinternal signals is shown in FIG. 8B.

Figure 8B:
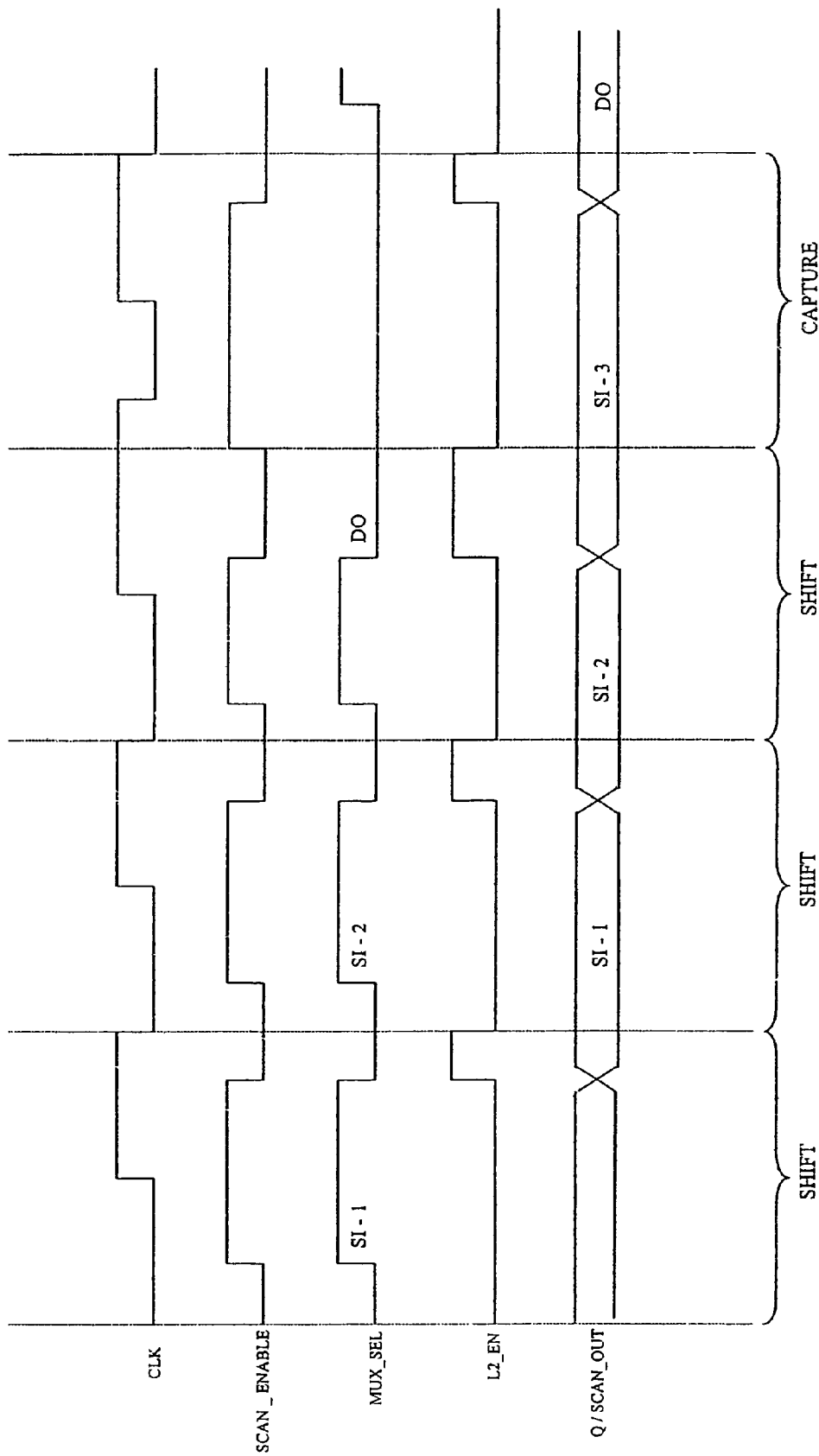

Three representative shift phases are shown in FIG. 8B. At the start of each shift phase, the clock CLK is low and its value is clocked to the Q output of input flip-flop 802 on the rising edge of scan enable signal SCAN_ENABLE. The complement of the output of flip-flop 802 is gated by AND gate 806 with scan enable signal SCAN_ENABLE to generate multiplexer select signal MUX_SEL. In turn, multiplexer select signal MUX_SEL selects the shift in (SI) input of multiplexer 801. The logic high level of clock signal CLK latches the bit at the cell shift input (SI) into level sensitive latch 803. Subsequently, the control signal L2_EN generated by gate 805 from clock CLK and the complement of scan enable signal SCAN_ENABLE, latches the bit being shifted through level sensitive latch 804 to the outputs SCAN_OUT and Q. This scan operation is repeated until the desired bits are shifted into or out of the scan chain, as required.

During the capture phase, the clock signal CLK starts at a logic high and on the next rising edge of the scan enable signal SCAN_ENABLE, the value of CLK, in this case a logic high, is clocked into flip-flop 802. The multiplexer select signal MUX SEL transitions to a logic low level. The capture bit at the D input to cell 800 is passed by multiplexer 801 and latch 803 on the following logic low level of clock signal CLK, and then latched into latch 803 on the following logic high level of clock signal CLK. Similar to the shift phase, the bit in latch 803 is moved to the output SCAN_OUT by output latch 804 under the control of control signal L2 EN generated by AND-gating, clock signal CLK and the complement of scan enable signal SCAN_ENABLE.

The timing and control of scan cell 800 insures that the data bit is not latched into output (slave) latch 804 until the input (master) latch 803 has latched the data at its input. By careful selection of the phase relationship between clock signal CLK and scan enable signal SCAN_ENABLE, the delay before latching data into the slave latch can be set to prevent shoot through, as well as reduce the criticality of clock skew balancing across the various scan chains. Moreover, since the selection between the scan and capture phases is implicit in the control signals, the number of control signals required is minimized as well.

In sum, the inventive principles described above provide several advantages over existing scan techniques. For example, by eliminating the problem of shoot-through, skew balancing the various clock domains and sub-domains becomes a much less critical issue. In turn, the constraints on the clock tree design and construction can be relaxed. Additionally, scan chains can now be formed to optimize physical placement of the scan cells and signal routing, since clock domain and sub-domain boundaries can be crossed. Other advantages include the fact that correct scan chain timing is inherent in the design and the fact that scan insertion does not require modification of the functional paths and associated loading.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A scan cell comprising:
   a scan cell data input and a scan cell shift input;
   input selection circuitry for selecting between the scan cell data and scan cell shift inputs during normal, capture, and shift modes in response to only a first control signal and a second control signal, the first and second control signals each switching between first and second logic levels, comprising:
   a first storage element for storing a bit representing a current one of the first and second logic levels of the first control signal in response to an edge of the second control signal; and
   multiplexing circuitry including a multiplexer having data inputs coupled to the scan cell data and scan cell shift inputs and a control input coupled to a gate, the gate having inputs receiving the bit stored in the first storage element and the second control signal, wherein the multiplexing circuitry is operable to:
      in the normal mode, select the scan cell data input in response to the first logic level of the second control signal;
      in the capture mode, select the scan cell data input when the bit stored in the first storage element represents the second logic level of the first control signal at a first edge of the second control signal, the first edge of the second control signal delayed from a transition of the first control signal to the second logic level; and
      in the shift mode, select the scan cell shift input when the bit stored in the first storage element represents the first logic level of the first control signal at a second edge of the second control signal, the second edge of the second control signal delayed from a transition of the first control signal to the first logic level;
   a second storage element for storing, in response to the second logic level of the first control signal, data presented at the selected one of the scan cell data and scan cell shift inputs; and
   a third storage element for storing, in response to the second logic level of the first control signal and the second logic level of the second control signal, data presented at an output of the second storage element.

2. The scan cell of claim 1, wherein the multiplexing circuitry is further operable to:
   in the capture mode, select the scan cell data input in response to a high logic level of the bit stored in the first storage element and a rising edge of the second control signal; and
   in the shift mode, select the scan cell shift input in response to a low logic level of the bit stored in the first storage element and another rising edge of the second control signal.

3. The scan cell of claim 1, wherein:
   the second storage element comprises a first latch for latching, in response to a high logic level of the first control signal, data presented at the selected one of the scan cell data and scan shift inputs; and
   the third storage element comprises a second latch for transferring the data latched in the first latch to a scan cell output after a time delay in response to a low logic level of the second control signal.

4. The scan cell of claim 3, wherein the second latch transfers the data latched in the first latch to the scan cell output in response to the high logic level of the first control signal and a low logic level of the second control signal.

5. The scan cell of claim 1, wherein the first control signal comprises a clock signal and the second control signal comprises a scan enable signal.

6. A method of operating a scan cell comprising:
   selecting between a scan cell data input and a scan cell shift input during normal, capture, and shift modes in response to only two control signals, the first and second control signals each switching between first and second logic levels comprising:
      storing in a first storage element a bit representing a current one of the first and second logic levels of a first one of the two control signals in response to an edge of a second one of the two control signals; and
      in the normal mode, selecting the scan cell data input in response to the first logic level of the second one of the two control signals;
   in the capture mode, selecting the scan cell data input when the stored bit stored in the first storage element represents the second
      logic level of the first of the two control signals at a first edge of the second control signal, the first edge of the second control signal delayed from a transition of the first control signal to the second logic level; and
      in the shift mode, selecting the scan cell shift input when the stored bit stored in the first storage element represents the first logic level of the first of the two control signals at a second edge of the second control signal, the second edge of the second control signal delayed from a transition of the first control signal to the second logic level;
   storing in a second storage element, in response to the second logic level of the first one of the two control signals, data presented at the selected one of the scan cell data and scan cell shift inputs; and
   storing in a third storage element, in response to the first logic level of the first control signal and the first logic level of the second control signal, data presented at an output of the second storage element.

7. The method of claim 6, further comprises:
in the capture mode, selecting the scan cell data input in response to a high logic level of the bit stored in the first storage element and a rising edge of the second of the two control signals; and
in the shift mode, selecting the scan cell data input in response to a low logic level of the bit stored in the first storage element and another rising edge of the second of the two control signals.

8. The method of claim 6, wherein:
storing data in the second storage element comprises latching in a first latch, in response to a high logic level of the first of the two control signals, data presented at the selected one of the scan cell data and scan data inputs; and
storing data in the third storage element comprises transferring the data latched in the first latch to a scan cell output from a second latch after a time delay in response to a low logic level of the second control signal.

9. The method of claim 8, wherein transferring the data latched in the first latch to the scan cell output with a second latch comprises transferring the data from the second latch in response to the high logic level of the first control signal and a low logic level of the second control signal.

10. The method of claim 6, wherein the first control signal comprises a clock signal and the second control signal comprises a scan enable signal.

11. An integrated circuit comprising:
a scan chain including a plurality of scan cells, at least one of the scan cells operating in one of normal, capture, and shift modes selected in response to only a clock signal and a scan enable signal, the at least one of the scan cells comprising:
   a scan cell data input and a scan cell shift input;
   a flip-flop for storing a bit representing a logic level of the clock signal at an edge of the scan enable signal;
   selector circuitry, including a multiplexer and a gate, for selecting between the scan cell data input and the scan cell shift input in response to the bit stored in the flip-flop, the selector circuitry operable to:
      in the normal mode, select the scan cell data input in response to a first logic level of the scan enable signal;
      in the capture mode, select the scan cell data input in response to a bit stored in the first storage element which represents a second logic level of the clock signal at the edge of the scan enable signal; and
      in the shift mode, select the scan cell shift input in response to a bit stored in the first storage element which represents the first logic level of the clock signal control at the edge of the scan enable signal;
   a level sensitive latch for storing in response to the second logic level of the clock signal data presented at the selected one of the scan cell data and scan cell shift inputs; and
   another level sensitive latch for transferring data stored in the level sensitive latch to an output of the scan cell after a delay implemented by at least one of the clock and scan enable signals.

12. The integrated circuit of claim 11, wherein in the normal mode the selector circuitry selects the scan cell data input in response to the scan enable signal being held in a selected from.

13. The integrated circuit of claim 11, wherein the selector circuitry selects between the scan cell data and scan cell shift data inputs during the capture and shift modes in response to the bit stored in the flip-flop and a second logic level of the scan enable signal.

14. The scan cell of claim 11, wherein the selector circuitry is operable to:
in the capture mode, select the scan cell data input when the bit stored in the flip-flop represents the second logic level of the clock signal at the edge of the scan enable signal and the scan enable signal is at a second logic level; and
in the shift mode, select the scan cell shift input when the bit in the flip-flop represents the first logic level of the clock signal at the edge of the scan enable signal and the scan enable signal is at the second logic level.

* * * * *